United States Patent

Tsuno et al.

[11] Patent Number: 5,993,919
[45] Date of Patent: Nov. 30, 1999

[54] METHOD OF SYNTHESIZING DIAMOND

[75] Inventors: Takashi Tsuno; Takahiro Imai; Kentaro Yoshida; Yoshiaki Kumazawa, all of Hyogo, Japan

[73] Assignee: Sumitomo Electric Industries, Ltd., Osaka, Japan

[21] Appl. No.: 08/984,609

[22] Filed: Dec. 3, 1997

[30]    Foreign Application Priority Data

Dec. 4, 1996   [JP]   Japan ..................................... 8-324001

[51] Int. Cl.$^6$ .............................. B05D 3/06; C23C 16/26
[52] U.S. Cl. .......................... 427/577; 427/249; 427/122
[58] Field of Search .................... 427/577, 249, 427/122; 117/929; 423/446

[56]            References Cited

U.S. PATENT DOCUMENTS 5,698,328  12/1997  Bunshah et al. ........................ 428/408

FOREIGN PATENT DOCUMENTS

| 0254312 | 1/1988 | European Pat. Off. . |
| 0254560 | 1/1988 | European Pat. Off. . |
| 60-065796 | 4/1985 | Japan . |
| 63-30397 | 2/1988 | Japan . |
| 1-052699 | 2/1989 | Japan . |
| 3-103397 | 4/1991 | Japan . |
| 5-270982 | 10/1993 | Japan . |

OTHER PUBLICATIONS

Article: "Epitaxial growth of diamond thin films on cubic boron nitride [111] surfaces by dc plasma chemical vapor deposition" by Koizumi et al.; pp. 563–565; Appln. Phys. Lett. vol. 57, No. 6, (1990).

Article: "Heteroepitaxial diamond growth on (100) silicon" by Jiang et al.; pp. 1112–1113; Diamond and Related Materials, No. 2, (1993).

Article: "Textured diamond growth on (100) β–SiC via microwave plasma chemical vapor deposition" by Stoner et al.; pp. 698–700; Appl. Phys. Lett. 60(6), Feb. 10, 1992.

Summaries of Lecture in the Fourth Diamond Symposium by Fujita et al.; pp. 13–14, (1991).

Inuzuka et al.; Extended Abstracts (the 43rd Spring Meeting, 1996), the Japan Society of applied Physics and Related Societies, No. 2, p. 403, 26a–T–9.

"Generation of diamond nuclei by electric field in plasma chemical vapor deposition" by Yugo et al.; pp. 1036–1038; Appl. Phys. Lett. vol. 58, No. 10, (1991).

"Synthesis of oriented textured diamond films on silicon via hot filament chemical vapor deposition", by Chen et al.; pp. 1853–1855; No. 13 (1995), Appl. Phys. Lett. vol. 67.

*Primary Examiner*—Roy V. King
*Attorney, Agent, or Firm*—W. F. Fasse; W. G. Fasse

[57]              ABSTRACT

In a method of synthesizing diamond on a substrate from plasma containing a carbon component, filaments containing tungsten as a thermoelectron-emitting material are arranged above a substrate in a chamber. An electrode is provided at a position separated from and particularly above the filaments. The filaments are at least temporarily energized with a potential relatively higher than that of the substrate, while the electrode is at least temporarily supplied with a potential relatively higher than that of the filaments. Thus, plasma is generated between the filaments and the substrate, while electrons are moved from the filaments to the electrode for also generating plasma between the filaments and the electrode, thereby forming nuclei of diamond on the substrate. Thereafter, the respective potentials of the electron emitting filaments and the electrode are equalized with each other, for growing a film of diamond from the nuclei of diamond.

22 Claims, 6 Drawing Sheets

METHOD OF SYNTHESIZING DIAMOND

BACKGROUND OF THE INVENTION

1. Field of the Invention

The present invention relates to a method of synthesizing diamond, and more particularly, it relates to a method of preparing a diamond film having a large area, which can be applied to a semiconductor material, an electronic component, an optical component, a cutting tool, a wear-resistant tool or a precision tool. The present invention also relates to diamond which is applicable to a substrate for a semiconductor device, a heat sink having high thermal conductivity or an optical component having a high light transmission property.

2. Description of the Background Art

Diamond has the following characteristics:

a. It has high strength.

b. It is excellent in wear resistance.

c. It has low compressibility and thermal expansivity.

d. It has extremely high thermal conductivity although it is an insulator.

e. It has a high refractive index, and is optically transparent with respect to ultraviolet, visible and infrared rays.

f. It has excellent chemical resistance.

g. It is excellent in sound wave propagation velocity.

h. It can provide semiconductivity when doped with a specific impurity.

In consideration of such characteristics, utilization of diamond in various fields is expected. Diamond is now regarded as a necessary and indispensable material in the industrial world.

A method of vapor-depositing diamond on a non-diamond substrate has recently been studied. In case of growing diamond on a non-diamond substrate, nuclei consisting of diamond grains are first formed on the substrate. Then, growth of diamond starts from the nuclei. In such vapor deposition of diamond, diamond is vapor-deposited in consideration of atomic arrangement on the substrate surface. When the surface of the substrate is oriented along a {100} plane, for example, diamond is grown on this substrate under such a condition that the diamond growth rate on the {100} plane is higher than those on the remaining planes. Methods described in the following literature references are known for growing diamond on non-diamond substrate:

(1) Koizumi et al. Appl. Phys. Lett. Vol. 57, No. 6 (1990), pp. 563–565

(2) Jiang and Klages, Diamond and Related Materials, No. 2 (1993), pp. 1112–1113

(3) Stoner and Glass, Appl. Phys. Lett. No. 60 (1992), p. 698

(4) Fujita et al., Summaries of Lectures in the Fourth Diamond Symposium (1991), pp. 13–14

(5) Inuzuka et al., Extended Abstracts (the 43rd Spring Meeting, 1996), the Japan Society of Applied Physics and Related Societies, No. 2, p. 403

(6) Yugo et al., Appl. Phys. Lett. Vol. 58, No. 10 (1991), pp. 1036–1038

Substrates consisting of cubic boron nitride, silicon and silicon carbide are employed in the methods of the above references (1), (2) and (3) respectively. Substrates consisting of nickel and copper, platinum, graphite, beryllium oxide or iridium are employed in the methods of the above references (4) and (5) respectively. A substrate consisting of silicon, silicon carbide or iridium is employed and subjected to negative biasing in the method of the above reference (6). In this negative biasing, the substrate is supplied with a low potential with respect to plasma in microwave plasma CVD (chemical vapor deposition). An effect of ion bombardment or radical concentration is proposed as a reaction mechanism for forming diamond in the method of reference (6). However, the reaction mechanism is not yet understood in detail.

In order to homogeneously form nuclei on the substrate by this method, plasma must be homogeneously generated and a uniform electric field must be generated on the surface of the substrate. However, it is difficult to implement such conditions, and hence diamond cannot be sufficiently grown on the substrate by the method of reference (6).

In relation to the method of reference (6), it is known that a large number of nuclei are formed when the strength of the electric field on the substrate surface is increased. If the strength of the electric field is excessive, however, it is difficult to obtain diamond of high quality due to formation of irregularly oriented diamond nuclei. On the other hand, a method of growing diamond on a substrate by thermal filament CVD is described in Chen et al., Appl. Phys. Lett. Vol. 67, No. 13 (1995), pp. 1853–1855.

This method succeeds in forming nuclei of diamond by supplying the substrate with a low potential with respect to filaments. In this method, radicals are conceivably formed by thermal filaments to generate dc (direct current) plasma by dc biasing.

Also in this method, however, it is difficult to uniformly generate an electric field on the substrate surface, and a problem has been reported whereby nuclei are formed only on an edge portion of the substrate. A problem whereby the discharge between the substrate and the filaments is destabilized has also been reported.

Japanese Patent Laying-Open No. 63-30397 (1988) describes a method of synthesizing diamond by extracting electrons from a thermoelectron-emitting material and discharging the same for generating plasma in the vicinity of a substrate. Also in this method, however, nuclei of diamond are so insufficiently grown that it is difficult to obtain high-quality diamond having a large area.

SUMMARY OF THE INVENTION

The present invention has been proposed in order to solve the aforementioned problems, and an object thereof is to provide a method of forming nuclei of diamond on a substrate, sufficiently growing the nuclei and synthesizing a diamond film on the substrate from the nuclei.

Another object of the present invention is to provide a method of homogeneously forming nuclei of diamond on a substrate in a large amount and synthesizing a high-quality diamond film having a large area on the substrate.

A method of synthesizing diamond according to a first aspect of the present invention is adapted to synthesize diamond on a substrate from a gas containing a carbon component, and comprises the following steps:

(a) providing an electron emitter containing a thermoelectron-emitting material above the substrate and providing an electrode at a position separated from the electron emitter;

(b) forming nuclei of diamond on the substrate by at least temporarily supplying the electron emitter with a potential relatively higher than that of the substrate while at least temporarily supplying the electrode with a potential relatively higher than that of the electron emitter, thereby generating plasma between the electron emitter and the substrate and moving electrons from the electron emitter to the electrode for generating plasma between the electrode and the electron emitter; and (c) equalizing the potentials of the electron emitter and the electrode with each other for growing a film of diamond from the nuclei of diamond.

According to this method, the electron emitter is supplied with a potential which is higher than that of the substrate, whereby electrons move from the substrate to the electron emitter. While plasma is generated between the substrate and the electron emitter due to the action of the electrons, the amount of this plasma is small. According to the present invention, however, a large number or amount of electrons move from the electron emitter to the electrode, whereby a large amount of plasma is generated between the electrode and the electron emitter. Therefore, a larger amount of plasma is generated between the substrate and the electron emitter due to excitation by the plasma between the electron emitter and the electrode, to form regularly oriented nuclei of diamond on the surface of the substrate.

The inventors have made various experiments, to recognize that a diamond film of higher quality can be grown when there is no potential difference between the electrode and the electron emitter as compared with a state of providing potential difference therebetween, in case of growing a diamond film from diamond nuclei. Thus, a diamond film is grown with no potential difference between the electrode and the electron emitter according to the present invention, whereby a high-quality diamond film can be obtained.

An ac potential is preferably supplied or applied between the electron emitter and the electrode. In this case, discharge is caused from the electron emitter to the electrode and vice versa. Therefore, the carbon component is inhibited from adhering to the surfaces of the electron emitter and the electrode so that a carbon compound is hardly deposited and the discharge is stabilized as compared with the case of causing discharge only from the electron emitter to the electrode.

The electron emitter is preferably arranged between the electrode and the substrate. Further, a plurality of electrodes are preferably provided and the potentials thereof are controlled independently of each other. In this case, the spatial distribution of the amount of plasma can be controlled by controlling the potentials of the respective electrodes. Thus, it is possible to uniformly generate the plasma, for homogeneously forming nuclei of diamond on the substrate. When diamond is grown from the nuclei, a high-quality diamond film having a large area can be obtained.

The substrate is preferably formed by a single-crystalline substance. Heteroepitaxial growth of diamond is enabled by employment of a single-crystalline substrate.

Heteroepitaxial growth of diamond is also enabled when an epitaxially grown thin film is first formed on the substrate surface. The substrate is preferably provided on its surface with a thin film layer of not more than 100 $\mu$m in thickness.

A method of synthesizing diamond according to a second aspect of the present invention is adapted to synthesize diamond on a substrate from plasma containing a carbon component, and comprises the following steps:

(a) providing a first electron emitter containing a thermoelectron-emitting material above the substrate and providing a second electron emitter containing a thermoelectron-emitting material at a position separated from the first electron emitter, and (b) at least temporarily supplying the second electron emitter with a potential higher than that of the first electron emitter, thereby generating plasma between the first electron emitter and the second electron emitter, while at least temporarily supplying the substrate with a potential lower than the mean potential of the first and second electron emitters, thereby generating plasma between the substrate and the first electron emitter and between the substrate and the second electron emitter.

According to this method, the first and second electron emitters are supplied with potentials relatively higher than that of the substrate. Therefore, electrons move from the substrate to the first and second electron emitters. While plasma is generated between the substrate and the first or second electron emitter due to the action of the electrons, the amount of this plasma is small. However, a large number or amount of electrons move from the first electron emitter to the second electron emitter, and hence a large amount of plasma is generated between the first and second electron emitters due to the action of the electrons. Thus, a larger amount of plasma is generated between the substrate and the first or second electron emitter due to excitation by the plasma between the first and second electron emitters. Thus, regularly oriented diamond nuclei are homogeneously formed on the surface of the substrate in a large amount by the plasma generated between the substrate and the first or second electron emitter. When diamond is grown from the nuclei, a high-quality diamond film having a large area can be prepared as a result.

A method of synthesizing diamond according to a third aspect of the present invention is adapted to synthesize diamond on a substrate from a gas containing a carbon component, and comprises the following steps:

(a) providing a first electron emitter containing a thermoelectron-emitting material above a substrate and providing a second electron emitter containing a thermoelectron-emitting material at a position separated from the first electron emitter;

(b) forming nuclei of diamond on the substrate by at least temporarily supplying the second electron emitter with a potential higher than that of the first electron emitter, thereby generating plasma between the first electron emitter and the second electron emitter, while at least temporarily supplying the substrate with a potential lower than the mean potential of the first and second electron emitters, thereby generating plasma between the substrate and the first electron emitter and between the substrate and the second electron emitter; and (c) equalizing the potential of the first electron emitter and that of the second electron emitter with each other for growing a film of diamond from the nuclei of diamond.

According to this method, the first and second electron emitters are supplied with potentials relatively higher than that of the substrate in the step (b). Therefore, electrons move from the substrate to the first and second electron emitters. While plasma is generated between the substrate and the first or second electron emitter due to the action of the electrons, the amount of this plasma is small. However, a large number or amount of electrons move from the first electron emitter to the second electron emitter, and hence a large amount of plasma is generated between the first and second electron emitters due to the action of the electrons. Thus, a larger amount of plasma is generated between the substrate and the first or second electron emitter due to excitation by the plasma between the first and second electron emitters. Therefore, regularly oriented nuclei of diamond are homogeneously formed on the surface of the substrate in a large amount by the plasma generated between the substrate and the first or second electron emitter. When the potentials of the first and second electron emitters are equalized with each other in the step (c) for growing diamond from the nuclei, a high-quality diamond film having a large area can be prepared.

According to the second or third aspect of the present invention, an ac potential is preferably supplied between the first and second electron emitters. In this case, discharge is caused from the first electron emitter to the second electron emitter and vice versa. Therefore, the carbon component is inhibited from adhering to the surfaces of the electron emitters so that a carbon compound is hardly deposited and the discharge is stabilized as compared with the case of causing discharge only from one of the electron emitters to the other one.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Figure 1:
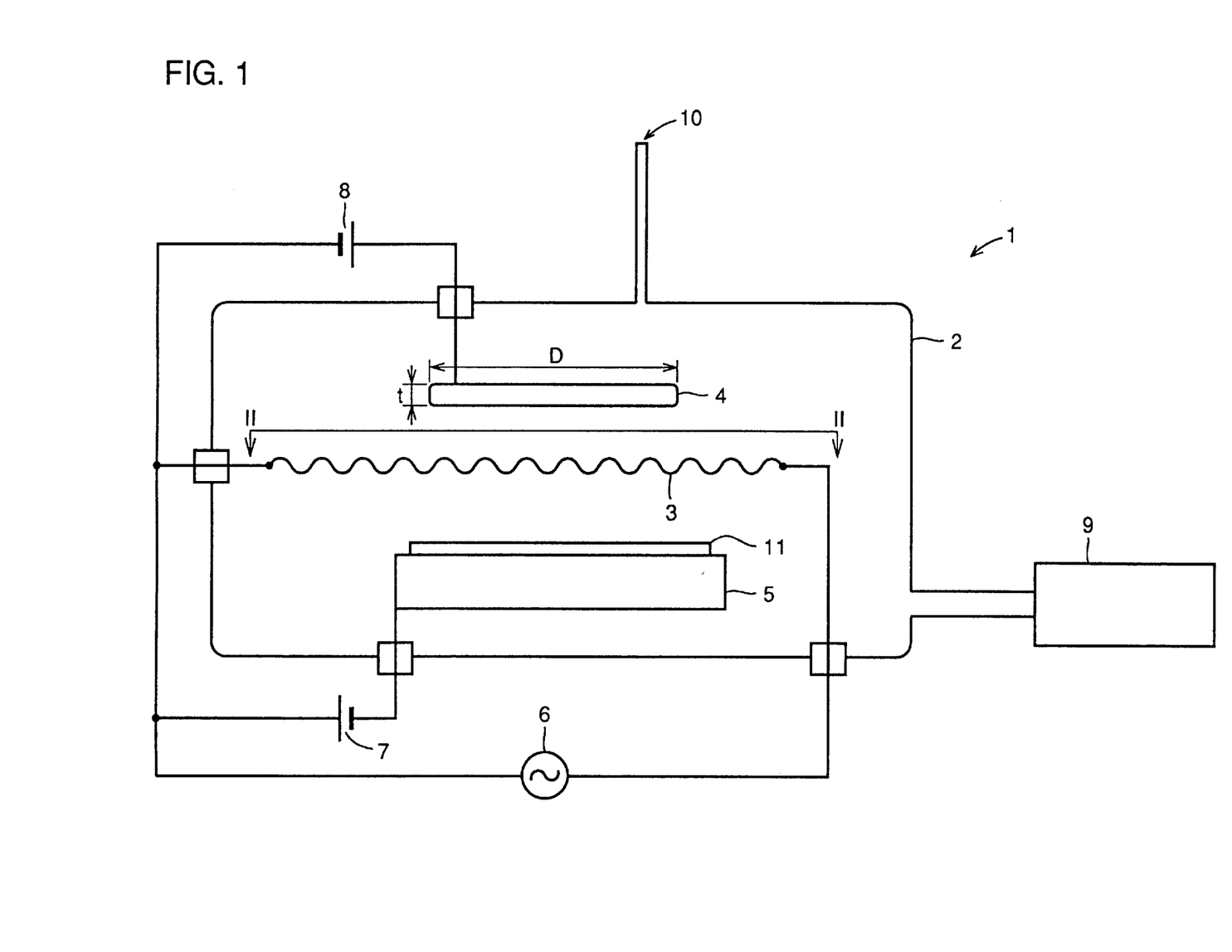
FIG. 1 is a model diagram of a diamond synthesizing apparatus employed in Examples 1, 2 and 5.
Figure 2:
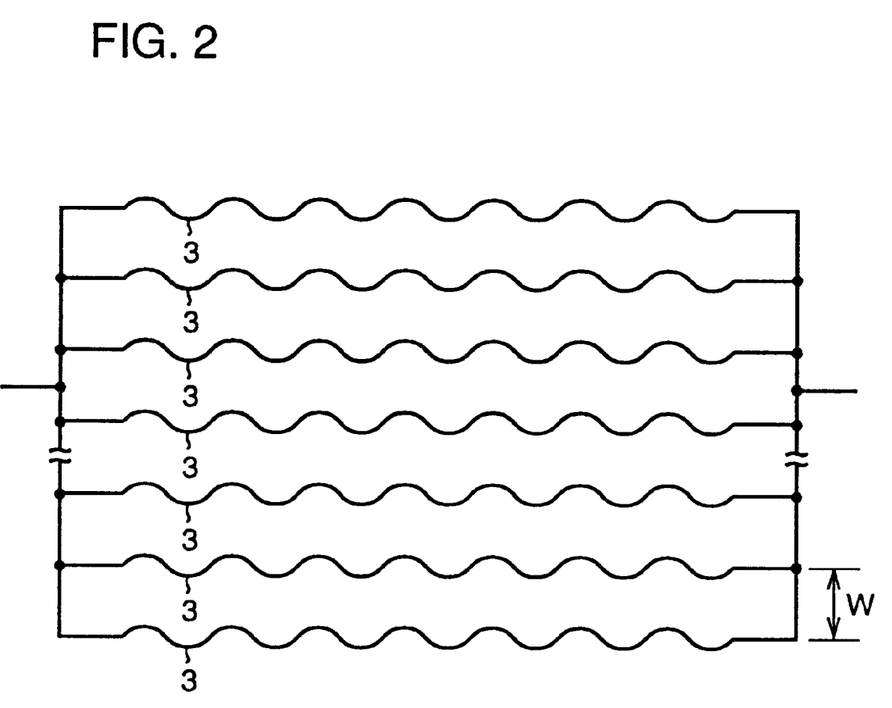
FIG. 2 is a wiring diagram of filaments as viewed along the line II—II in FIG. 1.

Referring to FIGS. 1 and 2, a diamond synthesizing apparatus 1 was formed by a chamber 2, filaments 3, an electrode 4, a support 5, an ac power source 6 and dc power sources 7 and 8.

The filaments 3 as electron emitters were provided in the chamber 2. Each filament 3 was formed by a tungsten wire of 10 cm in length and 0.2 mm in diameter. The number of the filaments 3 was 11. The distance (W in FIG. 2) between each adjacent pair of filaments 3 was 10 mm.

The electrode 4 consisting of tantalum (Ta) was provided above the filaments 3. The thickness (t in FIG. 1) of this electrode 4 was 2 mm. The diameter (D in FIG. 1) of the electrode 4 was 80 mm.

The support 5 was provided under the filaments 3. A substrate 11 consisting of single-crystalline silicon was placed on this support 5. The diameter of the substrate 11 was 3 inches. The surface part of the substrate 11 facing the filaments 3 was prepared from a (111) plane. The distance between the filaments 3 and the substrate 11 was 10 mm. The filaments 3 were electrically connected to the ac power source 6. The voltage and the frequency of the ac power source 6 were 40 V and 60 Hz respectively. The chamber 2 was electrically isolated from the ac power source 6. The support 5 consisted of a conductor. This support 5 was electrically connected with the negative electrode of the dc power source 7. The voltage of the dc power source 7 was 150 V. The positive electrode of the dc power source 7 was electrically connected with the filaments 3.

The voltage of the dc power source 8 was 60 V. The negative electrode of the dc power source 8 was electrically connected with the filaments 3, the positive electrode of the dc power source 7, and the ac power source 6. The positive electrode of the dc power source 8 was electrically connected with the electrode 4. The chamber 2 was electrically isolated from the dc power sources 7 and 8.

A gas inlet port 10 for introducing a raw material gas was provided in the chamber 2. A vacuum pump 9 was connected with the chamber 2, to be capable of adjusting the pressure in the chamber 2.

An attempt was made to form a diamond film on the (111) plane of the substrate 11 by the diamond synthesizing apparatus 1 having the aforementioned structure.

First, the pressure in the chamber 2 was adjusted to 100 Torr. Hydrogen and methane were introduced into the chamber 2 from the gas inlet port 10 at flow rates of 1000 sccm (standard cubic cm per minute) and 20 sccm respectively. At a flow rate of X sccm, a quantity of gas of X cm$^3$ in volume is supplied in a period of one minute at a temperature of 25° C. and under pressure of 1 atm. The temperature of the filaments 3 was 2000±20° C. The mean potential of the filaments 3 was lower than that of the electrode 4, and the difference therebetween was 60 V. Although it was impossible to visually confirm generation of plasma due to emission from the filaments 3, a current of 4 A flowed between the electrode 4 and the filaments 3. The mean potential of the filaments 3 was higher than that of the substrate 11, and the difference therebetween was 150 V. A current of 1 A flowed between the filaments 3 and the substrate 11.

The apparatus 1 was maintained in the state that the currents of 4 A and 1 A flowed between the electrode 4 and the filaments 3 and between the filaments 3 and the substrate 11 respectively for 30 minutes.

Then, the substrate 11 was taken out from the chamber 2, and its surface was observed with a scanning electron microscope (SEM). As a result, it was recognized that nuclei of diamond had been formed on the surface of the substrate 11 in a density of about $10^{10}/cm^2$.

Then, the substrate 11 was returned into the chamber 2, the dc power source 8 was detached, the potentials of the electrode 4 and the filaments 3 were equalized with each other, the pressure was set at 100 Torr, the flow rates of methane and hydrogen were adjusted to 2 sccm and 500 sccm respectively, and the temperature of the substrate 11 was set at 980° C. This state was maintained for 100 hours, for forming a diamond film on the surface of the substrate 11. As a result, it was recognized that a diamond film of 20 μm in thickness was formed substantially on the overall surface of the substrate 11 except a portion at a distance of 1 to 2 mm from its edge. This diamond film was observed with a SEM, to find that the crystal orientation of diamond substantially coincided with that of the substrate 11.

EXAMPLE 2

While the diameter of the substrate 11 consisting of single-crystalline silicon was 3 inches in Example 1, a single-crystalline silicon substrate 11 having a diameter of 1 inch was employed in Example 2. While the surface part of the substrate 11 facing the filaments 3 was prepared from the (111) plane in Example 1, a (100) plane was employed as the surface part of the substrate 11 facing the filaments 3 in Example 2. While a single substrate 11 was employed in Example 1, four substrates 11 were employed in Example 2. All these four substrates 11 were brought into contact with the support 5. The surface of one of the substrates 11 was scarified or scored with diamond of 5 μm in diameter. The remaining structure of the diamond synthesizing apparatus 1 was absolutely similar to that in Example 1.

In the apparatus 1 having the aforementioned structure, nuclei of diamond were formed on the surfaces of the substrates 11 through a process similar to that in Example 1. On the surfaces of the unscarified three substrates 11, the density of the nuclei was $5 \times 10^9/cm^2$. On the other hand, the density of the nuclei was $10^{10}/cm^2$ on the surface of the scarified substrate 11.

Then, the four substrates 11 provided with the nuclei of diamond were returned into the chamber 2, the potentials of the electrode 4 and the filaments 3 were equalized with each other, the pressure was adjusted to 100 Torr, the flow rates of methane and hydrogen were adjusted to 10 sccm and 500 sccm respectively and the temperature of the substrates 11 was set at 980° C., and this state was maintained for 20 hours. Thus, diamond films of 3 μm in thickness were formed substantially on the overall surfaces of the substrates 11 except outer peripheral parts of about 1 mm from edges thereof. These diamond films were observed with a SEM, to find that the crystal orientation of diamond substantially coincided with that of the substrates 11.

EXAMPLE 3

Figure 3:
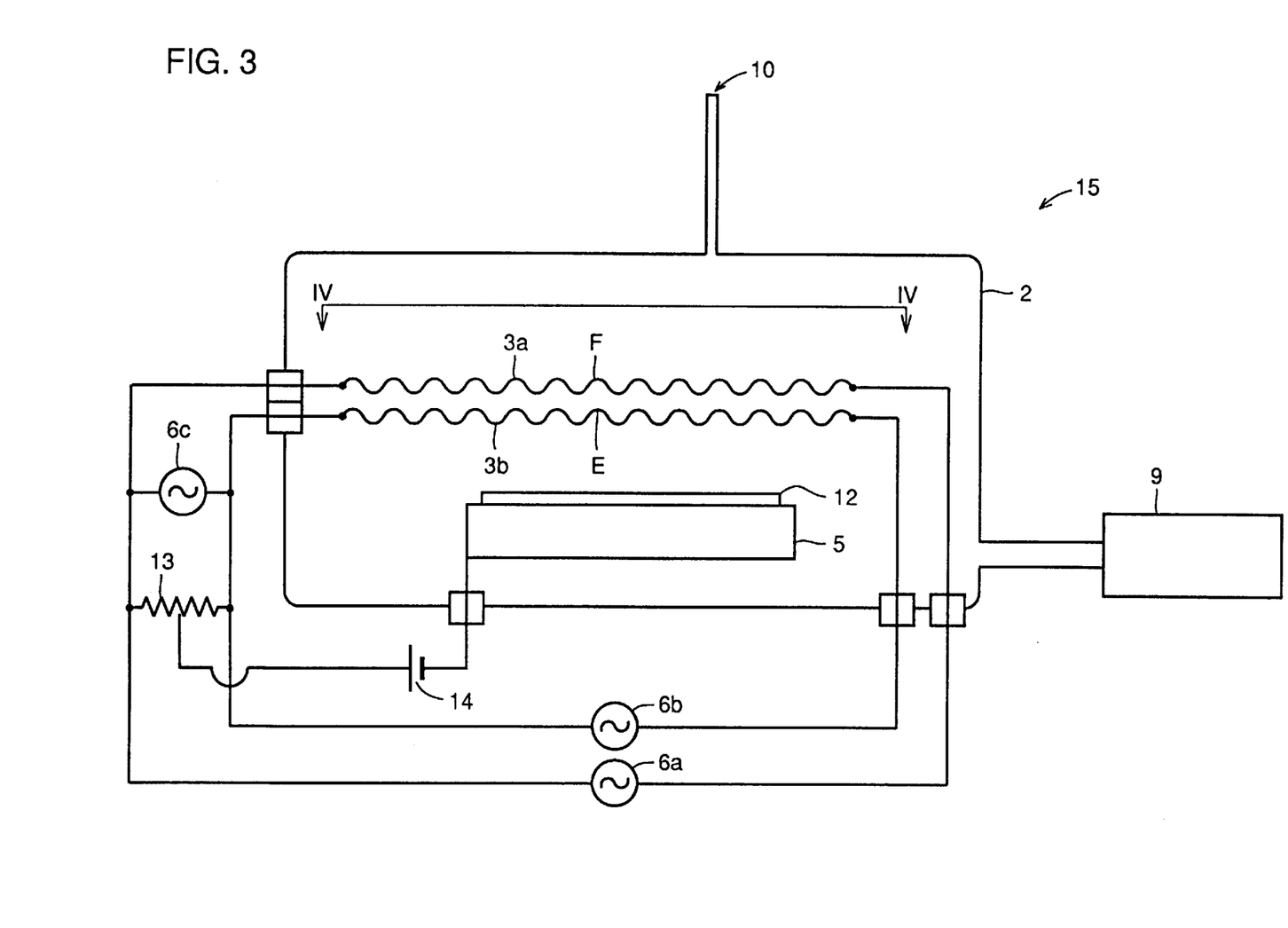
FIG. 3 is a model diagram of a diamond synthesizing apparatus employed in Example 3.
Figure 4:
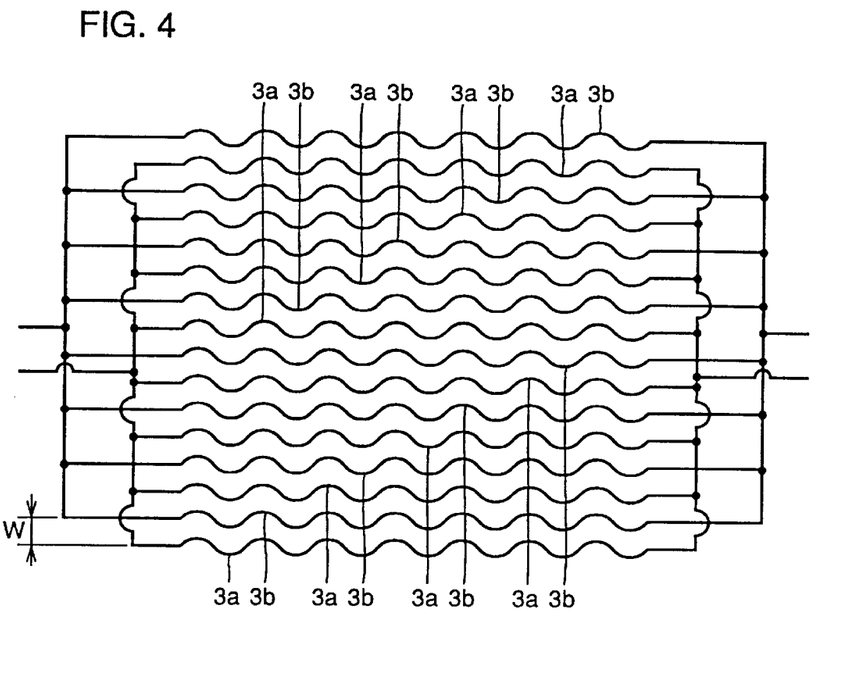
FIG. 4 is a wiring diagram of filaments as viewed along the line IV—IV in FIG. 3.

Referring to FIGS. 3 and 4, a diamond synthesizing apparatus 15 was formed by a chamber 2, filaments 3a and 3b, a support 5, ac power sources 6a, 6b and 6c, a dc power source 14 and a resistance 13.

The filaments 3a and 3b were provided in the chamber 2. These filaments 3a and 3b were formed by tungsten wires of 13 cm in length and 0.2 mm in diameter. The distance (W in FIG. 4) between each adjacent pair of filaments 3a and 3b was 10 mm. The number of the filaments 3a was eight, and that of the filaments 3b was also eight. The support 5 consisting of a conductor was provided under the filaments 3b. A substrate 12 consisting of single-crystalline silicon having a diameter of 4 inches was placed on the surface of the support 5. The surface part of the substrate 12 facing the filaments 3a and 3b was prepared from a (100) plane. The distance between the substrate 12 and the filaments 3b was 12 mm. The ac power source 6a was electrically connected with the filaments 3a. The voltage and the frequency of the ac power source 6a were 40 V and 60 Hz respectively. The ac power source 6b was electrically connected with the filaments 3b. The voltage and the frequency of the ac power source 6b were 40 V and 60 Hz respectively. The chamber 2 was electrically isolated from the ac power sources 6a and 6b. The negative electrode of the dc power source 14 was electrically connected with the support 5. The voltage of the dc power source 14 was 160 V. The positive electrode of this dc power source 14 was electrically connected with the resistance 13. The chamber 2 was electrically isolated from the dc power source 14. The ac power source 6c was provided to be electrically connected with the ac power sources 6a and 6b, the resistance 13 and the filaments 3a and 3b. The voltage and the frequency of the ac power source 6c were 100 V and 60 Hz respectively. A vacuum pump 9 and a gas inlet port 10 similar to those in Example 1 were employed.

The pressure of the chamber 2 of the diamond synthesizing apparatus 15 having the aforementioned structure was set at 15 to 30 Torr. Then, hydrogen and methane were introduced from the gas inlet port 10 at flow rates of 1000 sccm and 20 sccm respectively. The temperature of the filaments 3a and 3b was at 2000±20° C.

Figure 5:
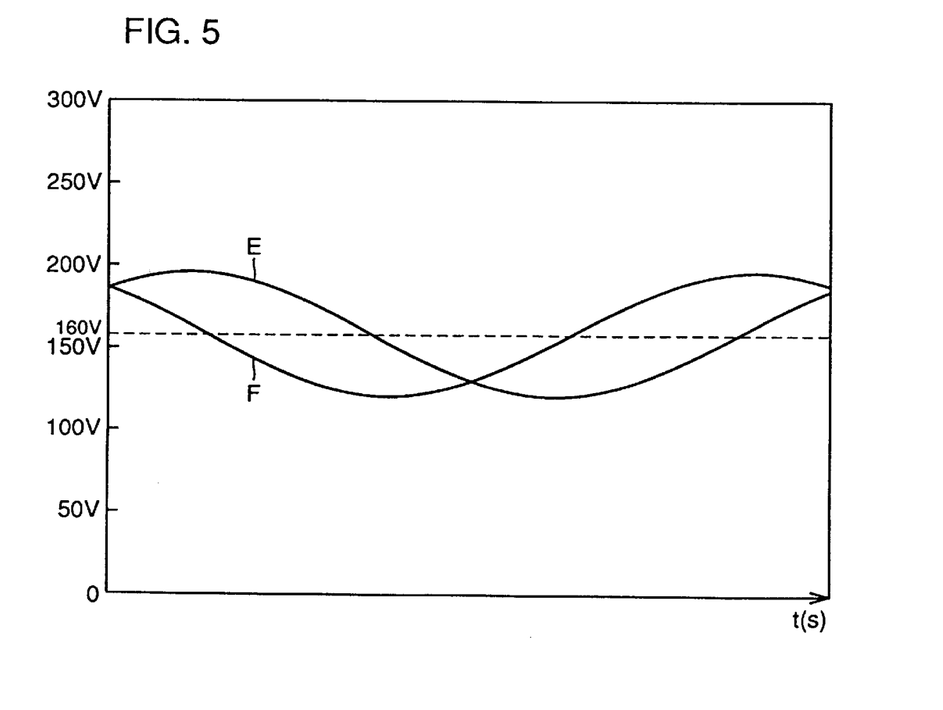
FIG. 5 illustrates time changes of potentials at points E and F in FIG. 3.

Referring to FIG. 5, the mean potential at a point E in FIG. 3 was 160 V. The mean potential at a point F in FIG. 3 was also 160 V. Further, it was confirmed that the potentials at the points E and F were different from each other. The maximum and minimum values of the potentials at the points E and F were about 200 V and about 120 V respectively. The mean potential of the substrate 12 was lower than those of the filaments 3a and 3b, and the difference therebetween was 160 V. This state was maintained for 10 minutes, thereby forming nuclei of diamond on the surface of the substrate 12. The substrate 12 was taken out from the chamber 2, to observe that the density of the nuclei of diamond on the surface of the substrate 12 was about $8 \times 10^9$ to $2 \times 10^{10}/cm^2$.

Then, the potentials of the filaments 3a and 3b were equalized with each other, and a diamond film was formed on the substrate 12 provided with the nuclei of diamond by plasma jet CVD with methane, hydrogen and argon gas. The film forming time was 30 hours, the temperature of the substrate 12 was 1020° C., and the gas flow ratios of methane, hydrogen and argon were 2:100:100.

The diamond film formed on the substrate 12 in the aforementioned manner exhibited thicknesses of 110 μm and 25 μm on central and end portions of the substrate 12 respectively. While the thickness on the end portion of the substrate 12 was about 20% of that on the central portion, it was confirmed that the orientation of this diamond film was coincident with that of the substrate 12 along the overall diamond film. No tungsten carbide was deposited on the surfaces of the filaments 3a and 3b due to discharge from the filaments 3a to the filaments 3b and vice versa in nucleation of diamond.

EXAMPLE 4

Figure 6:
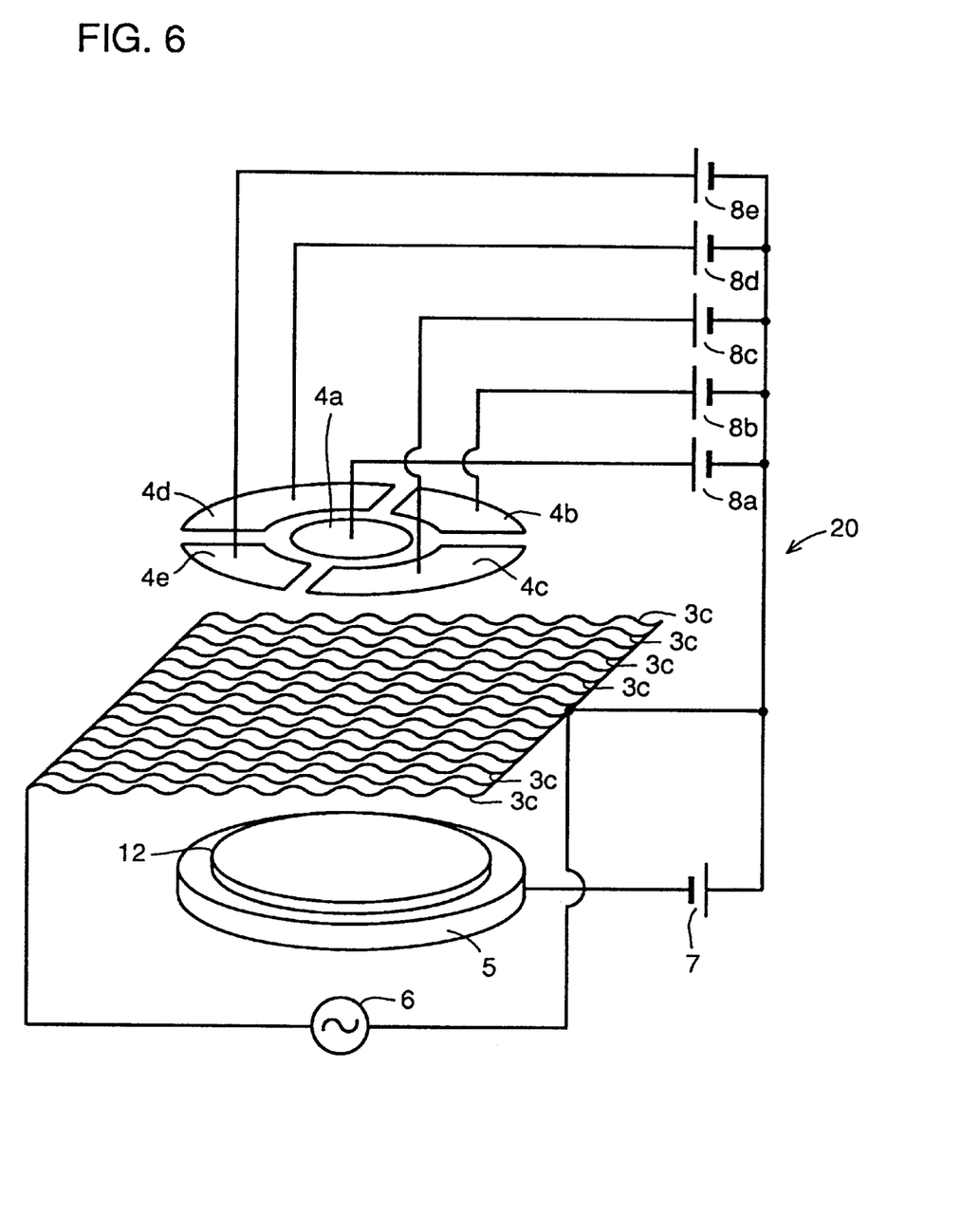
FIG. 6 is a model diagram of a diamond synthesizing apparatus employed in Example 4.

Referring to FIG. 6, a diamond synthesizing apparatus 20 was formed by a chamber (not shown), filaments 3c, electrodes 4a to 4e, a support 5, an ac power source 6 and dc power sources 7 and 8a to 8e.

The filaments 3c were formed by tungsten wires of 13 cm in length and 0.25 mm in diameter. The number of these filaments 3c was 16, and the distance between each adjacent pair of filaments 3c was 10 mm. The electrodes 4a to 4e were provided above the filaments 3c. These electrodes 4a to 4e consisted of molybdenum (Mo). The distance between the filaments 3c and the electrodes 4a to 4e was 5 mm. The thickness of each of the electrodes 4a to 4e was 2 mm. The area of each of the electrodes 4a to 4e was about 12 cm².

The support 5 was provided under the filaments 3c. This support 5 consisted of a conductor. A substrate 12 consisting of single-crystalline silicon was placed on the support 5. The diameter of the substrate 12 was 4 inches. The distance between the filaments 3c and the substrate 12 was 10 mm. The surface part of the substrate 12 facing the filaments 3c was prepared from a (100) plane.

The negative electrode of the dc power source 7 was electrically connected with the support 5. The voltage of the dc power source 7 was 110 V. The positive electrode of the dc power source 7, the filaments 3c and the negative electrodes of the dc power sources 8a to 8e were electrically connected with each other. The voltage of the dc power source 8a was 60 V. The voltages of the dc power sources 8b to 8e were 47 V. The positive electrodes of the dc power sources 8a to 8e were electrically connected with the electrodes 4a to 4e. The chamber (not shown) was provided to enclose the support 5, the substrate 12, the filaments 3c and the electrodes 4a to 4e.

In the diamond synthesizing apparatus 20 having the aforementioned structure, the internal pressure of the chamber was set at 40 Torr. Hydrogen and methane were introduced into the chamber at flow rates of 1000 sccm and 20 sccm respectively, and the temperature of the filaments 3c was maintained at 2000±20° C.

The difference between the mean potentials of the filaments 3c and the substrate 12 was 110 V. The difference between the mean potentials of the filaments 3c and the electrode 4a was 60 V, and that between the mean potentials of the filaments 3c and the electrodes 4b to 4e was 47 V. This state was maintained for 10 minutes, to form nuclei of diamond on the surface of the substrate 12. The surface of the substrate 12 was observed, to find that the nuclei of diamond were formed over the entire surface of the substrate 12. It was recognized that the density of the nuclei was $6 \times 10^9$ to $8 \times 10^9/cm^2$ i.e. a variation of 1 ⅓ times between the lowest density and the highest density and the nuclei were relatively homogeneously formed.

EXAMPLE 5

First, a substrate consisting of magnesium oxide (MgO) having a diameter of 1 inch was prepared. The surface of this substrate was prepared from a (100) plane of magnesium oxide. The temperature of this substrate was set at 950° C., and an iridium film was grown on the substrate surface by sputtering. The thickness of the iridium film was 0.4 $\mu$m.

Nuclei of diamond were grown on the iridium film provided on the substrate, in a method similar to Example 1. The density of the nuclei formed on the surface of the iridium film was about $1 \times 10^9/cm^2$.

Then, this substrate was returned into a chamber. The potentials of filaments and an electrode were equalized with each other, the pressure of the chamber was adjusted to 100 Torr, methane and hydrogen were fed at flow rates of 2 sccm and 500 sccm respectively and the temperature of the substrate was set at 790° C., for forming a diamond film for three hours under these conditions. As a result, a diamond film of 3 $\mu$m in thickness was grown on the surface of the iridium film. This diamond film was observed with a SEM, to recognize that the crystal orientation of diamond was substantially coincident with that of the iridium film.

Conventional Prior Art Example 1

Figure 7:
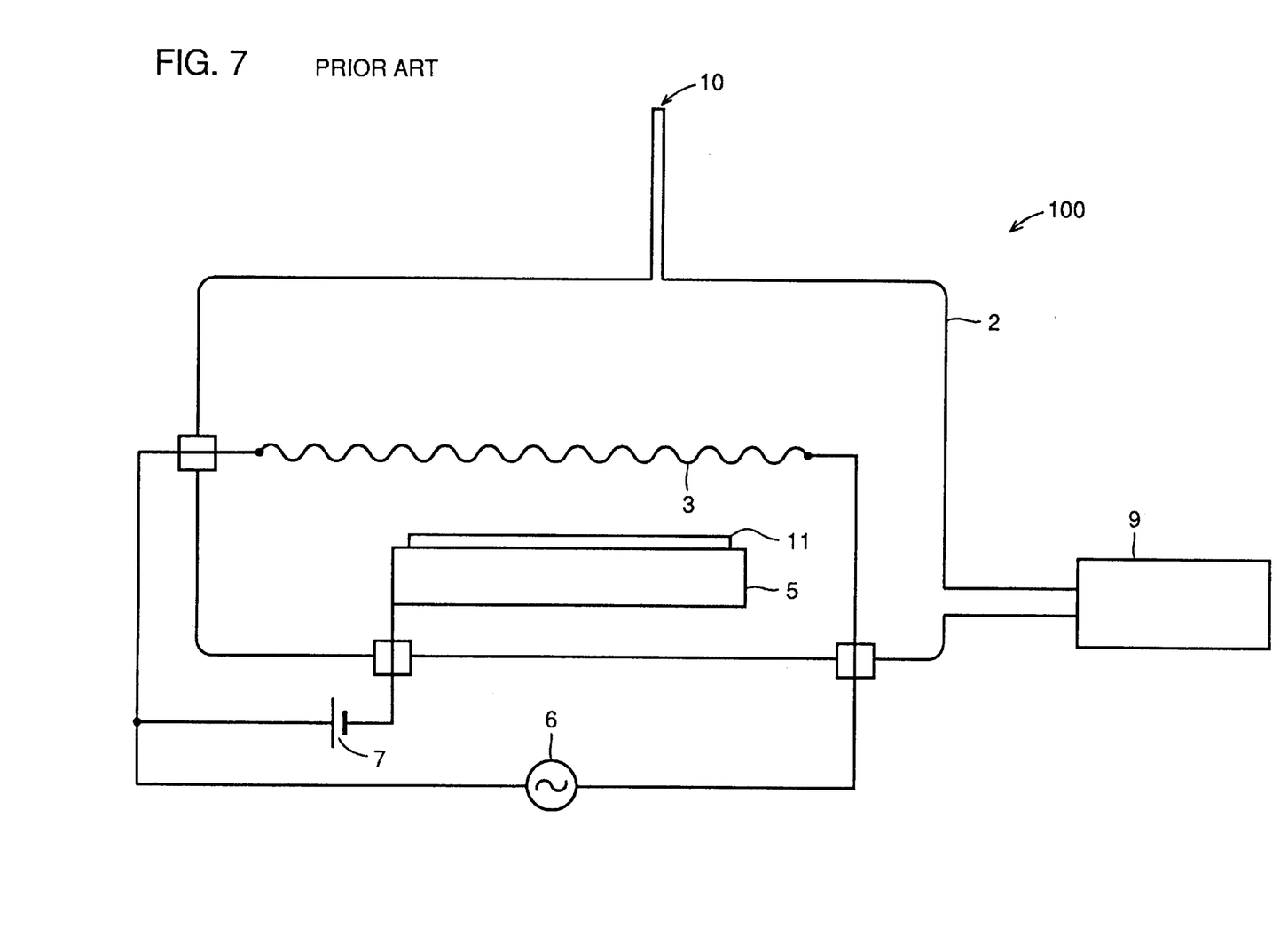
FIG. 7 is a model diagram of a diamond synthesizing apparatus employed in conventional prior art example 1.

Referring to FIG. 7, a prior art or conventional diamond synthesizing apparatus 100 was formed by removing the electrode 4 and the dc power source 8 from the diamond synthesizing apparatus 1 shown in FIG. 1. The remaining structure of this apparatus 100 was similar to that of the diamond synthesizing apparatus 1 shown in FIG. 1.

The pressure of a chamber 2 of the diamond synthesizing apparatus 100 having the aforementioned structure was set at 100 Torr, and hydrogen and methane were introduced into the chamber 2 from a gas inlet port 10 at flow rates of 1000 sccm and 20 sccm respectively. The temperature of filaments 3 was maintained at 2000±20° C.

The difference between the mean potentials of the filaments 3 and a substrate 11 was 150 V. The potential of the filaments 3 was higher than that of the substrate 11. At this time, no current flowed between the filaments 3 and the substrate 11. This state was maintained for 30 minutes, and thereafter the substrate 11 was taken out from the apparatus 100.

The substrate 11 was observed with a SEM, to recognize that nuclei of diamond were formed on the surface of the substrate 11 in density of $3 \times 10^7/cm^2$.

Then, this substrate 11 was returned into the chamber 2, the pressure was set at 100 Torr, the flow rates of methane and hydrogen were adjusted to 2 sccm and 500 sccm respectively and the temperature of the substrate 11 was set at 980° C., and this state was maintained for 100 hours, thereby forming a diamond film on the surface of the substrate 11. Although grown on the overall surface of the substrate 11, this diamond film was not continuous. The diamond film was observed with a SEM, to find that the crystal orientation of diamond was at random.

Conventional Prior Art Example 2

A diamond conventional synthesizing apparatus 100 similar to that employed in conventional example 1 was employed in conventional example 2. In this diamond synthesizing apparatus 100, the internal pressure of a chamber 2 was set at 100 Torr. Hydrogen and methane were introduced into the chamber 2 from a gas inlet port 10 at flow rates of 1000 sccm and 20 sccm respectively. The temperature of filaments 3 was maintained at 2000±20° C. When the difference between the mean potentials of the filaments 3 and a substrate 11 was 150 V, no discharge was established therebetween. Therefore, a dc power source was provided between the filaments 3 and the substrate 11, so that the difference between the mean potentials thereof was 250 V. At this time, the potentials of the filaments 3 were higher than that of the substrate 11. Then, intermittent discharge was established and the filaments 3 broke after 5 minutes.

Then, the surface of the substrate 11 was observed with a SEM, to find that nuclei of diamond were formed on this surface. It was recognized that the density of the nuclei was $3 \times 10^9/cm^2$ on a central portion of the substrate 11 and $3 \times 10^{10}/cm^2$ on a peripheral portion.

Then, the filaments 3 were exchanged for normal ones. The mean potential of the new filaments 3 was higher than that of the substrate 11 by 150 V. The substrate 11 was returned into the chamber 2, the pressure was set at 100 Torr, the flow rates of methane and hydrogen were adjusted to 2 sccm and 500 sccm respectively, the temperature of the substrate 11 was set at 980° C., and these conditions were maintained for 100 hours, thereby forming a diamond film on the surface of the substrate 11. As a result, it was recognized that a diamond film of 20 $\mu$m in thickness was grown substantially on the overall surface of the substrate 11 except a part at a distance of 1 to 2 mm from its end portion. This diamond film was observed with a SEM, to find that the crystal orientation of diamond was coincident with that of the substrate 11 in a central region of about 0.5 inches in diameter, and the former was incoincident with the latter outside of this central region.

Although Examples of the present invention have been described, the same can be modified in various ways. While three ac power sources 6a, 6b and 6c were employed in Example 3, for example, these power sources may be removed so that either filaments 3a or 3b temporarily have higher potentials.

While the dc power source 8 was employed in Example 1, for example, this power source may be replaced by an ac power source.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of synthesizing diamond on a substrate, in an apparatus including a chamber, an electron emitter containing a thermoelectron-emitting material arranged in said chamber, and an electrode arranged in said chamber at a position separate from said electron emitter, said method comprising the following steps:

arranging said substrate in said chamber below said electron emitter;

introducing a gas containing a carbon component into said chamber;

energizing said substrate to a first electric potential, energizing said electron emitter to a second electric potential, and energizing said electrode to a third electric potential, wherein said second electric potential of said electron emitter is at least temporarily higher than said first electric potential of said substrate and said third electric potential of said electrode is at least temporarily higher than said second electric potential of said electron emitter, so as to generate a first plasma containing said carbon component between said electron emitter and said substrate, and so as to move electrons from said electron emitter to said electrode and generate a second plasma containing said carbon component between said electrode and said electron emitter, and thereby forming diamond nuclei on said substrate; and thereafter equalizing said second and third electric potentials with each other, and thereby growing a diamond film on said substrate from said diamond nuclei.

2. The method of synthesizing diamond in accordance with claim 1, wherein said step of energizing said electron emitter and energizing said electrode comprises applying an ac potential between said electron emitter and said electrode.

3. The method of synthesizing diamond in accordance with claim 1, wherein said electron emitter is arranged in said chamber between said electrode and said substrate.

4. The method of synthesizing diamond in accordance with claim 1, wherein said apparatus includes a plurality of said electrodes, and said method further comprises energizing respective ones of said electrodes to respective independent ones of said third electric potential, and controlling said independent third electric potentials independently of each other.

5. The method of synthesizing diamond in accordance with claim 4, wherein said plurality of electrodes includes a central area electrode and at least one peripheral area electrode arranged outwardly around said central area electrode and lying in a same plane as said central area electrode, and wherein said step of arranging said substrate in said chamber comprises centering said substrate below said central area electrode.

6. The method of synthesizing diamond in accordance with claim 4, wherein said steps of independently controlling said independent third electric potentials and forming said diamond nuclei are carried out so that a density distribution of said diamond nuclei, which includes a highest density and a lowest density at different areas of said substrate, has a uniformity defined by said highest density being no more than 1 ⅓ times said lowest density.

7. The method of synthesizing diamond in accordance with claim 1, wherein said substrate is a single-crystalline substance.

8. The method of synthesizing diamond in accordance with claim 7, wherein said step of growing said diamond film comprises heteroepitaxially growing said diamond film on said single-crystalline substance so that all of said diamond film has a substantially uniform crystal orientation coinciding with a crystal orientation of said single-crystalline substance.

9. The method of synthesizing diamond in accordance with claim 7, further comprising a preliminary step of providing said substrate with an exposed surface oriented on one of a (100) crystal plane and a (111) crystal plane.

10. The method of synthesizing diamond in accordance with claim 1, wherein said substrate includes a base material and a thin film layer of a different material on a surface of said base material, and said method further comprises a preliminary step of forming said thin film layer to have a thickness of not more than 100 $\mu$m on said surface of said base material before said step of forming said diamond nuclei on said substrate.

11. The method of synthesizing diamond in accordance with claim 10, wherein said step of growing said diamond film comprises heteroepitaxially growing said diamond film on said thin film layer, so that all of said diamond film has a substantially uniform crystal orientation coinciding with a crystal orientation of said thin film layer.

12. The method of synthesizing diamond in accordance with claim 1, wherein said step of forming said diamond nuclei is continued until a density of said diamond nuclei on said substrate is at least about $8 \times 10^9 / cm^2$.

13. The method of synthesizing diamond in accordance with claim 1, further comprising a step of scarifying a surface of said substrate before said step of forming said diamond nuclei thereon.

14. The method of synthesizing diamond in accordance with claim 1, wherein said substrate has a surface area with a diameter of at least 3 inches, and wherein said steps are carried out so as to grow said diamond film continuously over substantially all of said surface area except for a perimeter edge of no more than 2 mm width.

15. The method of synthesizing diamond in accordance with claim 1, wherein all parts of said electron emitter are respectively energized to said second electric potential which is at least temporarily higher than said first electric potential of said substrate.

16. The method of synthesizing diamond in accordance with claim 15, wherein said electron emitter includes a plurality of parallel filaments lying in a common plane and electrically connected parallel to each other.

17. The method of synthesizing diamond in accordance with claim 1, wherein said second electric potential is higher than said first electric potential at the same time when said third electric potential is higher than said second electric potential.

18. A method of synthesizing diamond on a substrate in an apparatus including a chamber, a first electron emitter containing a thermoelectron-emitting material arranged in said chamber, and a second electron emitter containing a thermoelectron-emitting material arranged in said chamber at a position separate from said first electron emitter, said method comprising the following steps:

arranging said substrate in said chamber below said first electron emitter;

introducing a carbon component into said chamber;

energizing said first electron emitter to a first electric potential, energizing said second electron emitter to a second electric potential, and energizing said substrate to a third electric potential, wherein said second electric potential of said second electron emitter is at least temporarily higher than said first electric potential of said first electron emitter so as to generate a first plasma containing said carbon component between said first and second electron emitters, and wherein said third electric potential of said substrate is at least temporarily lower than the mean potential of said first and second potentials so as to generate a second plasma containing said carbon component between said substrate and said first electron emitter and between said substrate and said second electron emitter.

19. The method of synthesizing diamond in accordance with claim 18, wherein said step of energizing said first electron emitter and energizing said second electron emitter comprises applying an ac potential between said first and second electron emitters.

20. The method of synthesizing diamond in accordance with claim 18, wherein said step of respectively energizing said first and second electron emitters and said substrate so as to generate said first and second plasmas is carried out so as to form diamond nuclei on said substrate, and further comprising a subsequent step of equalizing said first and second electric potentials with each other, and thereby growing a diamond film on said substrate from said diamond nuclei.

21. The method of synthesizing diamond in accordance with claim 20, wherein said step of energizing said first electron emitter and energizing said second electron emitter comprises applying an ac potential between said first and second electron emitters.

22. The method of synthesizing diamond in accordance with claim 18, wherein said first and second electron emitters each respectively comprise a respective plurality of filaments that lie in a respective common plane and that are electrically connected in parallel with each other, with said filaments of said second electron emitter arranged above and horizontally interdigitally offset from said filaments of said first electron emitter.

* * * * *